United States Patent
Lim et al.

(10) Patent No.: US 6,271,133 B1
(45) Date of Patent: Aug. 7, 2001

(54) OPTIMIZED CO/TI-SALICIDE SCHEME FOR SHALLOW JUNCTION DEEP SUB-MICRON DEVICE FABRICATION

(75) Inventors: Chong Wee Lim, J.B. (MY); Eng Hua Lim, Singapore (SG); Kin Leong Pey, Singapore (SG); Soh Yun Siah, Singapore (SG); Chun Hui Low, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/290,918

(22) Filed: Apr. 12, 1999

(51) Int. Cl.[7] .......................... H01L 21/44; H01L 21/336
(52) U.S. Cl. .................... 438/683; 438/297; 438/303; 438/592; 438/970
(58) Field of Search .................... 438/297, 303, 438/970, 683, 296, 532, 533, 586, 596, 592, 595, 304, 305, 655

(56) References Cited

U.S. PATENT DOCUMENTS

| | | |
|---|---|---|
| 5,073,510 * | 12/1991 | Kwon et al. .................. 438/297 |
| 5,208,472 | 5/1993 | Su et al. ...................... 257/344 |
| 5,352,631 | 10/1994 | Sitaram et al. ............... 437/200 |
| 5,447,875 | 9/1995 | Moslehi ........................ 437/41 |
| 5,464,782 | 11/1995 | Koh .............................. 437/41 |
| 5,705,417 | 1/1998 | Tseng ........................... 437/44 |
| 5,710,438 | 1/1998 | Oda et al. ...................... 257/69 |
| 5,726,479 | 3/1998 | Matsumoto et al. .......... 257/412 |
| 5,731,239 * | 3/1998 | Wong et al. ................. 438/296 |
| 5,736,461 | 4/1998 | Berti et al. .................. 438/651 |
| 5,933,741 * | 8/1999 | Tseng ........................... 438/303 |
| 6,010,954 * | 1/2000 | Ho et al. ..................... 438/596 |

\* cited by examiner

*Primary Examiner*—Matthew Smith
*Assistant Examiner*—Igwe Uma Anya
(74) *Attorney, Agent, or Firm*—George O. Saile; Rosemary L. S. Pike

(57) ABSTRACT

A new method is established to form different silicide layers over the top of the gate electrode and the surface of the source/drain regions. A thin layer of $TiSi_2$ is formed over the source/drain regions by depositing a layer of titanium and annealing this layer with the silicon substrate. The gate electrode is created as a recessed electrode, in the top recession of the electrode a layer of $CoSi_2$ is formed by depositing a layer of cobalt over the gate electrode. This layer of $CoSi_2$ serves as the electrical gate contact point.

24 Claims, 3 Drawing Sheets

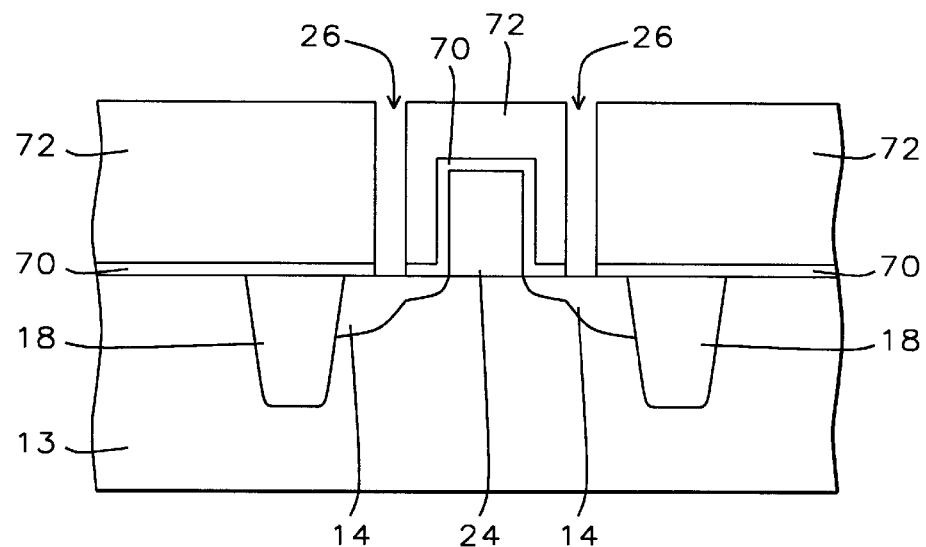
FIG. 1 – Prior Art
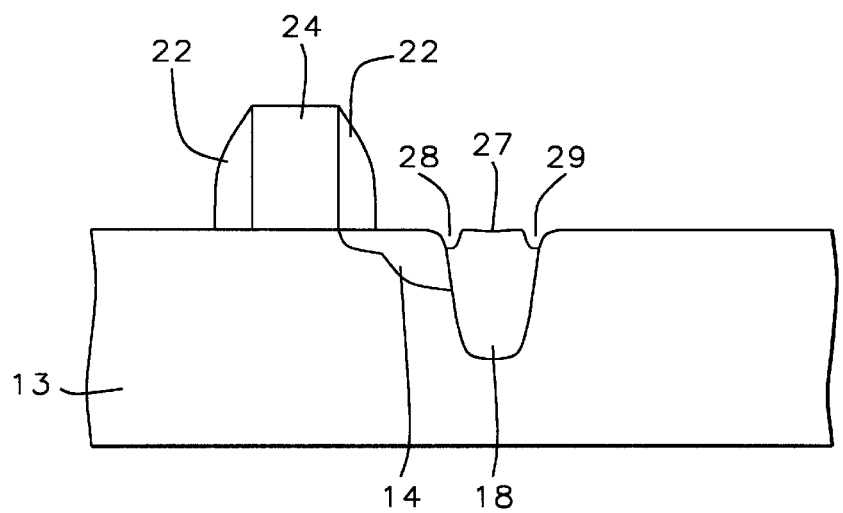
FIG. 2 – Prior Art

OPTIMIZED CO/TI-SALICIDE SCHEME FOR SHALLOW JUNCTION DEEP SUB-MICRON DEVICE FABRICATION

BACKGROUND OF THE INVENTION (1) Field of the Invention

The invention relates to the fabrication of integrated circuit devices, and more particularly, to a process for a FET with $TiSi_2$ S/D contacts and $CoSi_x$ gate contacts.

(2) Description of the Prior Art

Field Effect Transistors (FET's) have found wide application in the semiconductor industry. The fabrication of a FET typically starts with a single crystal semiconductor substrate; a thin layer of gate oxide is grown over the surface of the substrate. A polysilicon gate is patterned over the thin layer of gate oxide, the gate electrode is then used as a diffusion or implant barrier mask to form self-aligned source and drain areas in the substrate immediately adjacent to the sides of the gate electrode. The region between the source/drain regions is called the channel region, the distance between the source and the drain junction is called the channel length. In its simplest terms of operation, an input voltage is applied to the gate electrode, this voltage establishes an electric field in the channel region of the device, and this electric field is perpendicular to the surface of the substrate and the thin layer of gate oxide. By varying the value of the applied voltage, the conductance of the channel region can be controlled. Because the electric field that is established by this voltage controls the output current flow through the device, the semiconductor devices created using this approach are called Field Effect Transistors (FET's).

In a typical FET, metal contacts are established with the gate electrode and with the source and the drain regions of the transistor. This can be done by sputtering a layer of refractory metal over the exposed surface of these areas. By heating this layer of metal (typically titanium, tantalum, platinum, nickel or cobalt) to a temperature of between 200 and 850 degrees C., a self-aligned salicide region is formed on top of the gate electrode and on the source and drain regions.

Prior to the deposition of the above indicated layer of metal, contact holes to the source/drain regions have to be opened through the thin layer of gate oxide. As transistor dimensions have decreased, the conventional contact structures began to limit device performance. It was, for instance, not possible to minimize the contact resistance if the contact hole was of minimum size while problems with cleaning small contact holes became a concern. In addition, the area of the source/drain regions could not be minimized because the contact hole had been aligned to this region using a separate masking step whereby extra area had to be allocated to accommodate misalignment. It was also practice to use several, small contact holes of identical size meaning that the full width of the source/drain region was not available for the contact structure. This resulted in the source/drain resistance being proportionally larger than it would have been in a device having minimum width.

Self-alignment is a technique in which multiple regions on the wafer are formed using a single mask, thereby eliminating the alignment tolerances that are required by additional masks. As circuit sizes decrease, this approach finds more application. One of the areas where the technique of self-alignment was used at a very early stage was the self-aligned source and gate implant to the poly gate.

One of the alternate structures that have been employed in an effort to alleviate the problem of increased source/drain resistance is the formation of self-aligned silicides on the source/drain regions. Where these silicides are formed at the same time as the polycide structure, this approach is referred to as a salicide process. The entire source/drain region (of, for instance, a MOSFET device) is contacted with a conductor film. This approach becomes even more attractive where such a film can be formed using a self-aligned process that does not entail any masking steps.

Continuous shrinkage of the gate length demands low resistivity of the source/drain regions, as well as shallow junctions in the source/drain areas to avoid short channel effect, which is mainly caused by inappropriate dopant distribution underneath the channel region. Shallow junctions greatly help resolve this problem.

Various techniques have been developed for forming the shallow source/drain junctions that are needed for sub-micron CMOS devices. One such approach uses As for the n-channel devices while $BF_2^+$ is used for the p-channel devices. Yet another approach uses the creation of so-called elevated source-drain. A thin (for instance 0.2 um.) epitaxial layer of silicon can be selectively deposited onto the exposed source/drain areas of the MOS transistor, this following the implantation of the lightly doped region of the LDD structure and the formation of the spacers. This process leads to the formation of heavily doped, shallow source/drain regions. The source/drain junction depths in this case are less than 0.2 um.

FIG. 1 shows Prior Art formation of a gate electrode with contact openings for the source/drain regions. A polysilicon gate structure 24 is formed including the formation of Shallow Trench Isolation (STI) regions 18 between the gate structures. After the source and drain areas 12 and 14 have been implanted to form the source/drain junctions, the sidewall spacers (not shown) are formed. Spacers can be made using silicon-nitride or silicon-oxide, BSG, PSG, polysilicon, other materials preferably of a dielectric nature, CVD oxide formed from a TEOS source. Often used are amorphous materials that inhibit the deposition of epitaxial silicon thereupon.

A thick (2-layer deposition) layer 70 of undoped oxide is deposited over the gate electrode 24, the adjacent STI regions 18 and the exposed surface of the semiconductor substrate 13. Over this layer 70, a layer 72 of boronphosphosilicate glass (BPSG) needs to be added for conventional contacts. Contact holes 26 are opened in layer 72 and layer 70 down to the source/drain regions, these contact openings typically have a width of between 0.20 and 0.30 um.

FIG. 2 shows the effect that exposure to wet cleaning can have on the surface of the STI areas. Gate electrode 24 is shown together with gate spacers 22 and an adjacent STI region 18. The surface 27 of the STI 18 shows two irregularities in the areas 28 and 29 where this surface 27 interfaces with the surface of the semiconductor substrate 13. During the formation of the STI region, the silicon in the areas 28 and 29 can be exposed by wet cleaning. The exposed silicon can be salicided at that time and can therefore cause leakage currents to occur. On the other hand, a thicker silicide layer can result in higher leakage current especially for shallow junction devices.

The salicide process further has a limitation related to the fact that the gate and the source/drain silicides are formed at the same time. On the gate, it is desirable for the silicide to have the lowest possible sheet resistance (so the gate electrode will have a low interconnect resistance). To achieve this, a thick silicide layer is needed. Over the source/drain regions, however, the silicide can only be of limited thickness in order to prevent excess consumption of the substrate silicon by silicide formation. Thus, a thicker silicide, though favorable at the gate level, is detrimental to shallow junction devices.

U.S. Pat. No. 5,731,239 (Wong et al.) discloses a process for a FET with $TiSi_2$ S/D contacts 26 and $CoSi_x$ gate contacts 30, see col. 7, lines 4 to 14. A main purpose of the invention is to form two different material silicide layers over (a) the gate and (b) the S/D. This patent uses CMP to remove a second layer of insulator with $Si_3N_4$ as a stop layer.

U.S. Pat. No. 5,352,631 (Sitaram et al.) shows a method of forming a FET with a first Metal Silicide (e.g. $TiSi_x$) S/D contacts (see col. 4, lines 16–35) and second metal silicide (e.g., refractory metal, see col. 5, lines 15–17.) gate contacts. See claim 1. See FIGS. 1 to 5. A main purpose of the patent is to form two different material silicide layers over (a) the gate and (b) the S/D. This patent forms the silicide first, after which the source/drain regions are formed using ion implant. The top layer of the gate contains $TiSi_2$.

U.S. Pat. No. 5,447,875 (Moslehi) shows a method for forming 2 different composition Silicide layers over the S/D and Gate.

U.S. Pat. No. 5,464,782 (Koh) shows a salicide process using Ti.

U.S. Pat. No. 5,710,438 (Oda et al.) shows a Salicide process using Co.

U.S. Pat. No. 5,208,472 (Su et al.) shows a salicide process using two spacers.

U.S. Pat. No. 5,705,417 (Tseng) shows a salicide process using Ti or Co.

U.S. Pat. No. 5,726,479 (Matsumoto et al.) shows a salicide process on a gate with a large contact area.

U.S. Pat. No. 5,736,461 (Berti et al.) shows a salicide structure with both $TiSi_x$ and $CoSi_x$ on the S/D and gate.

SUMMARY OF THE INVENTION

An objective of the invention is to reduce excessive consumption of substrate silicon in the formation of salicide source/drain electrical contacts.

Another objective of the present invention is to provide an economical method for the formation of shallow salicide junctions.

Another objective of the invention is to eliminate the narrow line width effect for the gate contact region thereby eliminating the effect of increased sheet resistance for smaller gate electrode device dimensions.

Another objective of the invention is to eliminate the adverse effect that silicon consumption has on the formation of shallow junctions.

Another objective of the invention is to eliminate leakage currents between the source/drain contacts and the gate contact after contact salicidation.

Another objective of the invention is to minimize leakage currents of the source and drain regions.

In accordance with the objectives of the invention a new method is established to form different silicide layers over the top of the gate electrode and the surface of the source/drain regions. The shallow trench isolation regions are formed in the surface of the semiconductor substrate, a layer of polysilicon is deposited over the substrate. The gate electrode is patterned, the gate spacers are formed. During this latter process a layer of TiN is formed on the top surface of the gate electrode. The source/drain regions are doped together with the shallow doping under the gate spacers. A layer of Ti is deposited over the gate electrode and the surface of the adjacent source/drain regions and the STI regions, this layer reacts with the silicon of the substrate surface and forms a thin layer of $TiSi_2$ over the source/drain regions. The unreacted Ti is removed together with the TiN layer on the top surface of the gate electrode making the gate electrode a recessed gate structure. A film of Co is now deposited over the surface of the (recessed) gate electrode, the gate spacers and the area immediately surrounding the gate electrode including the STI areas. This layer of Co reacts with the polysilicon of the top surface of the gate electrode forming $CoSi_2$. $CoSi_2$ has the characteristic that the electrical resistance of lines formed using $CoSi_2$ is independent of the line width. The unreacted layer of Co is removed leaving the gate electrode with a top surface of $CoSi_2$ (no line-width effect for making electrical contact with the gate electrode) while the top surface of the source/drain regions consists of a thin layer of $TiSi_2$ thereby minimizing source/drain region junction leakage currents. By creating a thin layer of $TiSi_2$ on the surface of the source/drain regions, silicon consumption (that is typical of the Prior Art salicidation process for the formation of contact regions over the source/drain regions) is sharply reduced.

BRIEF DESCRIPTION OF THE DRAWINGS

FIG. 1 shows a cross section of a Prior Art gate electrode with source/drain contact points.

FIG. 2 shows STI surface damage that can occur by wet cleaning during the formation of the STI regions.

DETAILED DESCRIPTION OF THE PREFERRED EMBODIMENTS

Figure 3:
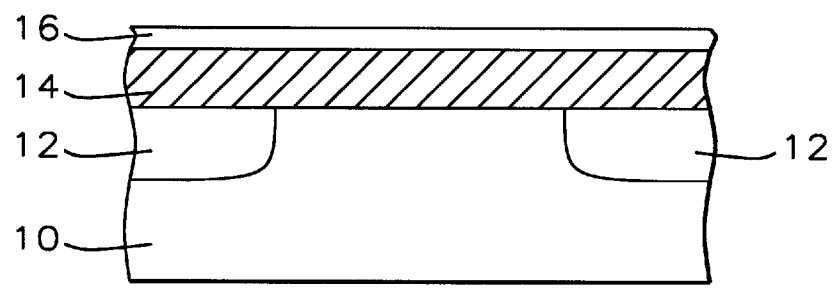
FIG. 3 shows cross section of a semiconductor substrate after the deposition of a layer of polysilicon and a layer of TiN.

Referring now specifically to FIG. 3, there is shown a cross section of the semiconductor substrate 10, the Shallow Trench Isolation (STI) areas 12 that have been formed in the surface of the substrate 10, a layer 14 of polysilicon that has been deposited over the surface of substrate 10 while a layer 16 of TiN has been deposited over the layer of polysilicon 14. The layer 14 of polysilicon will be patterned to form the gate electrode, the layer 16 of TiN will be patterned to form the top layer or cap of the gate electrode.

The layer of polysilicon can be doped as follows:

for NMOS: N+ doped using As or P as a dopant with a dopant concentration of between about $1 \times 10^{15}$ and $1 \times 10^{20}$ atoms/cm$^3$ for PMOS: P+ doped using $BF_2$ or B as a dopant with a dopant concentration of between about $1 \times 10^{15}$ and $1 \times 10^{20}$ atoms/cm$^3$ Prior technology applied the LOCOS process to create field isolation of devices on a silicon substrate. This process used silicon nitride as a mask and applied selective oxidation of the silicon surface to form the field isolation regions. This process however causes lateral oxidation of the silicon under the nitride mask resulting in the well know bird's beak effect, where the isolation regions have none-linear and poorly defined vertical boundaries. This resulted in considerable reduction of packaging density. This negative effect is not present when the Shallow Trench Isolation (STI) process is used to form the field isolation regions. Shallow trenches are formed in the silicon substrate by first creating $Si_3N_4$ hard mask over the active areas of the silicon substrate. The silicon substrate is etched in the field regions using for instance a RIE etch. The method involves filling the trenches with a chemical vapor deposition (CVD) silicon oxide ($SiO_2$) and then applying an etch back or mechanically/chemically polishing to yield a planar surface. STI regions are formed around the active device to a depth between 2000 and 6000 Angstrom.

Polysilicon layer 14 is typically deposited using low-pressure vapor deposition (LPCVD) using, for example, silane ($SiH_4$). The thickness of polysilicon layer 14 is between 1500 and 3000 Angstrom. Layer 16 is preferably deposited by LPCVD using a reactant gas such as $SiH_4$ or $SiH_2Cl_2$, typically in a temperature range of between 700 and 800 degrees C., to a thickness of about between 1500 and 3000 Angstrom.

Figure 4:
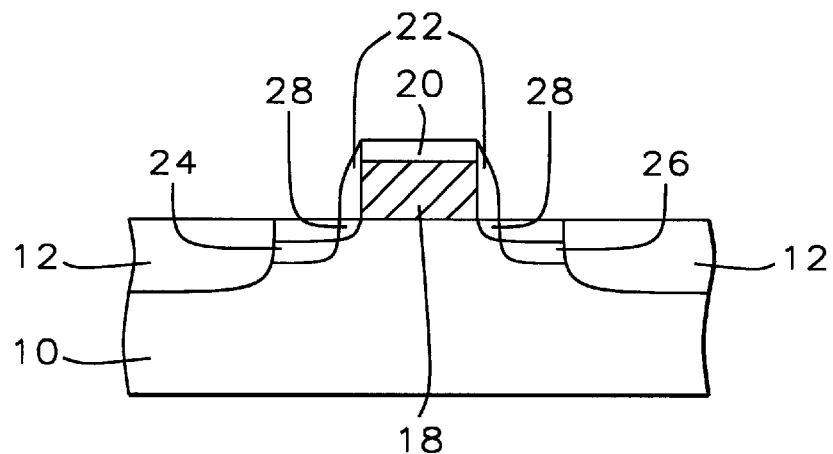
FIG. 4 shows a cross section after the formation of the gate electrode with the gate spacers and the doping of the source/drain regions.

FIG. 4 shows a cross section after layers 14 and 16 (FIG. 3) have been patterned and etched. The polysilicon gate structure 18 has been created, spacers 22 are formed adjacent to and in contact with the gate structure 18. A layer 20 of TiN remains on the top surface of the poly gate electrode 18, layer 20 is also bounded by the gate spacers 22. Further shown are the implanted source (24) and drain (26) regions together with the shallow implants 28 (LDD's) under the gate spacers 22. The latter implants of the doped regions will, for purposes of clarity, not be shown in the following figures.

Layers 14 and 16 are typically etched using anisotropic etching with an etchant gas of one of the group of $CF_4$, $CHF_3$, $CHCl_3$, $CCl_4$, $BCl_4$ and $Cl_2$ at a temperature between about 100 and 200 degrees C. Layer 20 of TiN is typically between about 500 and 1500 Angstrom thick.

The LDD implant is typically performed as follows:
For NMOS: As—energy 1 to 10 keV
—dose 1e14 to 1e16 atoms/cm$^2$
For PMOS: $BF_2$—energy 1 to 10 keV
—dose 1e14 to 5e15 atoms/cm$^2$.

It must be emphasized at this point that the source/drain formation takes place before the formation of the surface of the substrate over the source/drain regions where the electrical contacts with the source/drain regions will be established. During conventional practices, the silicide (for the electrical contacts) is formed first after which the ion implant for the source/drain regions is performed. In conventional processes a layer of $CoSi_x$ is often formed instead of a layer of silicide because it is easier for the source/drain ion implant to penetrate $CoSi_x$ rather than react with the Ti that is present in the silicide if $TiSi_2$ is used to prepare the substrate surface for the establishing of the electrical contact points of the source/drain regions. The invention, by first forming the source/drain regions and after that preparing the surface of the substrate for the electrical contact points and by creating a layer on the surface of the substrate that contains $TiSi_2$, prevents the problems of conventional processes.

Typical separation between the source and the drain region of the gate electrode is 0.2 um. This separation follows from a typical physical gate length of 0.10 um and a spacer width of 0.05 um.

Spacers can be made using silicon-nitride or silicon-oxide, BSG, PSG, polysilicon, other materials preferably of a dielectric nature, CVD oxide formed from a TEOS source. Often used are amorphous materials that inhibit the deposition of epitaxial silicon thereupon. A silicon oxide spacer can be formed via anisotropic RIE of said silicon oxide layer, using $CHF_3$ or $CF_4$—$O_2$—He as an etchant. A silicon nitride spacer can be formed via anisotropic RIE of said silicon nitride layer, using $CHF_3$ or $SF_6$—$O_2$ as an etchant.

LDD areas for the source and drain regions can be formed immediately after the formation of the spacers by ion implantation for the n$^+$ and the p$^+$ contacts followed by annealing.

Figure 5:
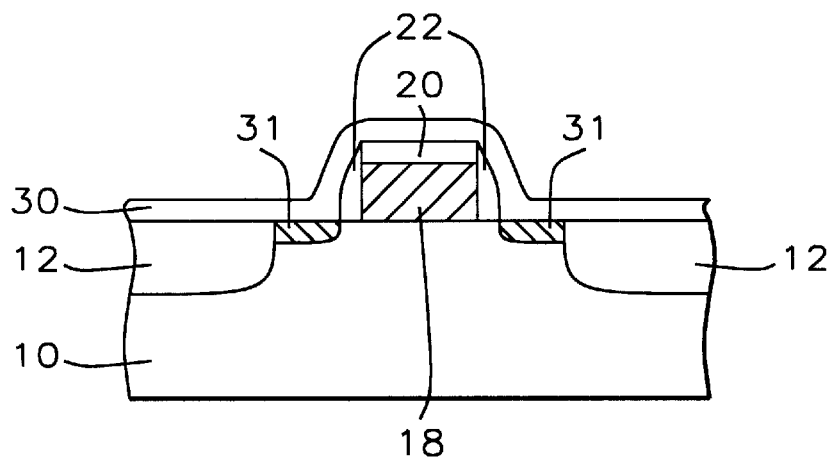
FIG. 5 shows a cross section after the deposition of a layer of Ti and the formation of thin layer of $TiSi_2$ over the source/drain regions.

The source/drain implant 24/26 is typically performed as follows, this implant forms the S/D regions 24/26.
Conditions for implant 24/26 are as follows:
For n$^+$/p$^+$ NMOS: As—energy: 15 to 100 keV
—dose: 1e14 to 5e16 atoms/cm$^2$
P—energy: 10 to 100 keV
—dose: 1e16 to 5e16 atoms/cm$^2$
Typical conditions for the doping are as follows:
For PMOS: B—energy: 1 to 50 keV
—dose: 1e13 to 1e16 atoms/cm$^2$
BF2—energy: 5 to 180 keV
—dose: 1e13 to 1e16 atoms/cm$^2$ FIG. 5 shows the deposition of a blanket layer 30 of Ti that is deposited over the surface of the top layer 20 of the gate electrode 18/20, the exposed sides of the spacers 22, the surface of the source/drain regions 24/26, (FIG. 4) and the adjacent STI areas 12. The main purpose of layer 30 is to form reactant layers 31 of $TiSi_2$ over the surface of the source/drain regions 24/26 (FIG. 4). The silicon of the substrate reacts with the layer of Ti forming $TiSi_2$, this reaction is an annealing process. No $TiSi_2$ forms over the gate due to the presence of the TiN cap layer 20.

Layer 30 of Ti can be deposited by physical sputtering from a Ti target to a thickness of between about 150 and 450 Angstroms.

The annealing process of the Ti film into the substrate over the source/drain regions is typically a Rapid Thermal Annealing (RTA) process at a temperature of between about 600 and 850 degrees C. for a time between about 20 and 60 seconds.

A typical annealing process is rapid thermal annealing in a temperature range of between about 600 and 850 degrees C. for a time between about 20 and 60 seconds used to activate the dopants and to form reactant layers 31 of $TiSi_2$. A second temperature step of about 850 degrees C. in nitrogen ($N_2$) or argon can be carried out to lower the $TiSi_2$ sheet resistance and to complete the $TiSi_2$ phase of the reaction.

Figure 6:
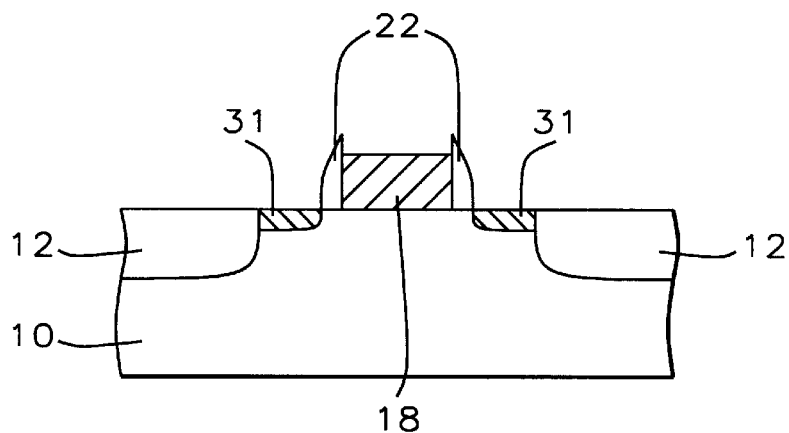
FIG. 6 shows a cross section after simultaneous removal of the unreacted Ti and the removal of the TiN cap from the gate electrode.

FIG. 6 shows the simultaneous removal of the unreacted layer 30 (FIG. 5) of Ti and the removal of the top layer 20 (FIG. 5) of TiN of the gate electrode 18/20 (FIG. 3).

A typical process to remove the unreacted Ti is a wet etch, such as deionized water (DI) with 30% hydrogen peroxide ($H_2O_2$) and ammonium hydroxide ($NH_4OH$)

Figure 7:
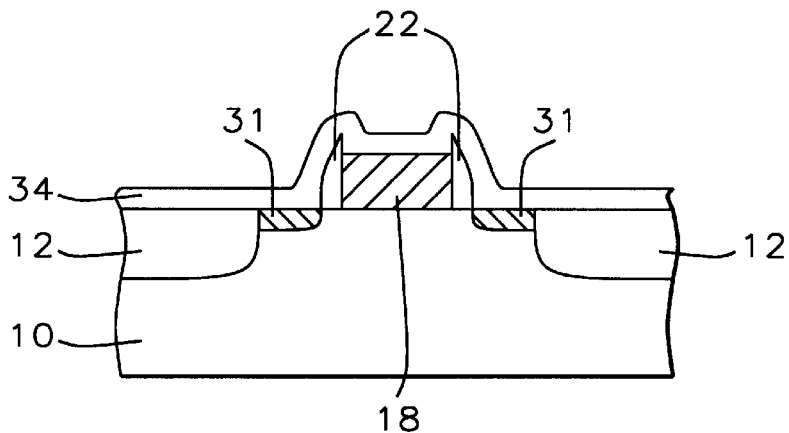
FIG. 7 shows a cross section after the deposition of a layer of Co.

FIG. 7 shows a cross section after a blanket deposition of a layer 34 of Co. The Co will chemically react by annealing with the poly of the gate 18 and create a layer of $CoSi_2$ at the interface between the Co and the poly. No reaction occurs between the deposited layer of Co and the $TiSi_2$ of layer 31. Layer 34 is typically deposited to a thickness of between about 100 and 300 Angstrom.

The cobalt anneal is typically performed at a temperature between about 500 and 850 degrees C. at atmospheric pressure or in a $N_2$ environment (also under atmospheric pressure) for a time between about 20 and 60 seconds.

Layer 34 is deposited using a PVD sputtering process.

Figure 8:
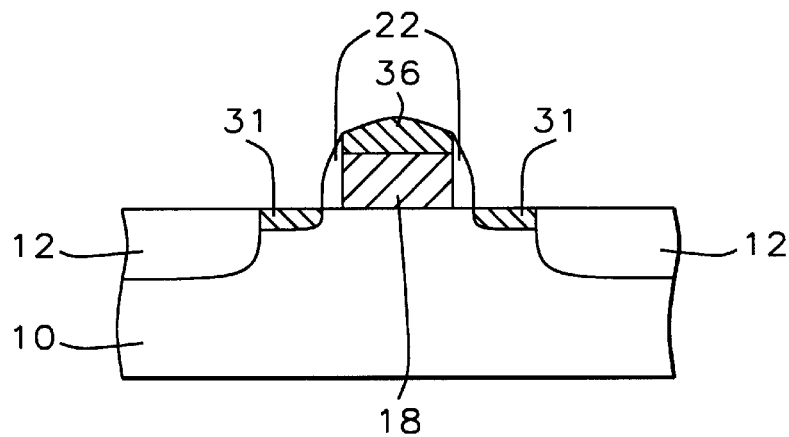
FIG. 8 shows a cross section after the formation of a layer of $CoSi_2$ on the surface of the gate electrode and the removal of the unreacted Co.

FIG. 8 shows the results after removing the unreacted Co. The top surface of the gate electrode now contains layer 36 of $CoSi_2$. $CoSi_2$ does not, as previously pointed out, have the small line effect, line resistance will therefore remain low and independent on the width of the line. This characteristic is clearly an important advantage for the creation of increasingly smaller devices. A further advantage of the creation of the top surface 36 of the electrode containing $CoSi_2$ is that $CoSi_2$ is of smaller grain size when compared with the frequently formed top surface of $TiSi_2$ for the top surface of the gate electrode. This brings the added advantage that electrical contact with the gate electrode is easier to establish while this contact has improved characteristics of reliability as compared with Prior Art electrical contacts.

The $CoSi_2$ anneal is typically performed at a temperature between about 500 and 850 degrees C. at atmospheric pressure or in a $N_2$ environment (also under atmospheric pressure) using a RTA process for a time between about 20 And 60 seconds.

From the cross section shown in FIG. 8 it is clear that the following objectives have been obtained:

- the top surface of the gate electrode contains $CoSi_2$. $CoSi_2$ is of smaller grain size than conventional $TiSi_2$ and thereby forms a better contact interface.
- the top surface of the gate electrode contains $CoSi_2$. $CoSi_2$ does not have the line-width effect, which means that the line resistance for the electrical contact that is to be established with the top of the gate electrode is not dependent on the width of the gate contact area. The line resistance for conventionally used $TiSi_2$ is highly dependent on the line width.
- The top surface of the substrate in the source/drain regions contains $TiSi_2$ which means that less silicon substrate was consumed in forming electrical contact areas for the source/drain regions when compared with typically used Co. The comparative numbers are that, per Angstrom of deposited metal to form electrical contacts, 2.27 Angstrom of silicon substrate is used for the case where the surface of the substrate contains a $TiSi_2$ interface as opposed to 3.64 Angstrom for a typical interface that contains Co.
- The top surface of the substrate in the source/drain regions contains $TiSi_2$, which minimizes surface junction leakage currents in the source/drain regions because now silicon atoms form the dominant diffusion species in these regions and avoid the possible $CoSi_2$ spiking problem that is currently widely reported.

In sum: the invention provides better contact characteristics for the gate electrode, no narrow line effect for the gate electrode contact, less silicon consumption in forming the metal contacts with the source/drain regions (which facilitate the formation of shallow junctions), minimized surface leakage currents in the source/drain regions.

While the present invention has been described with reference to an illustrative embodiment, this description is not to be construed in a limiting sense. Various modifications and combinations, as well as other embodiments of the invention reference to the description. It is therefore intended that the appended claims encompass any such modifications or embodiments.

What is claimed is:

1. A method of fabricating Field Effect Transistor (FET's) having low sheet resistance gate electrodes comprising the steps of:

providing a semiconductor substrate;
forming FET devices in and on said substrate, each FET device having a polysilicon gate with spacers on the gate sidewalls and adjacent source/drain regions in said substrate, each FET device further having a cap layer on top of said poly gate, said cap layer being formed by depositing a layer of titanium nitride over a layer of polysilicon of said polysilicon gate after which said layer of titanium nitride and said layer of polysilicon are etched, thereby forming said polysilicon gate over which said cap of titanium nitride remains in place;
depositing a blanket layer of titanium (Ti) over said gate electrode and its adjacent areas;
annealing said titanium to form titanium silicide ($TiSi_2$) over said source/drain contact areas;
removing unreacted Ti from above said gate electrode and its adjacent areas;
removing said cap layer from above said gate electrode;
depositing a layer of cobalt over said gate and its adjacent areas;
annealing said cobalt to form $CoSi_2$ over said gate; and
removing unreacted cobalt from above said gate electrode and its adjacent areas.

2. The method of claim 1 wherein said annealing said titanium to form titanium silicide ($TiSi_2$) over said source/drain regions is a rapid thermal annealing in a temperature range of between 600 and 700 degrees C. for a time of between 20 and 40 seconds and then rapid thermal annealing in a temperature of between about 800 and 900 degrees C. for a time between 20 and 40 seconds.

3. The method of claim 1 wherein said annealing said deposited layer of cobalt thereby creating $CoSi_2$ over said gate is annealing at a temperature between about 500 and 850 degrees C.

4. A method of fabricating Field Effect Transistor (FET's) having low sheet resistance gate electrodes comprising the steps of:

providing a semiconductor substrate;
forming shallow trench isolation areas surrounding and electrically isolating device areas;
depositing a polysilicon layer on said substrate;
depositing a layer of titanium nitride on said polysilicon layer;
patterning said titanium nitride layer and said polysilicon layer by photoresist masking and anisotropic etching thereby forming said gate electrodes and leaving portions over the top of said gate electrodes;
forming lightly doped source/drain areas adjacent to said gate electrodes by ion implantation;
depositing a conformal dielectric layer over said gate electrode and the surface of said substrate;
anisotropically etching back said conformal dielectric layer thereby forming sidewall spacers on said gate electrode;
forming source/drain contact areas by ion implantation adjacent to said sidewall spacers;
depositing a blanket layer of titanium (Ti) over said gate electrode and the areas adjacent to said gate electrode thereby including said shallow trench isolation regions;
annealing said titanium to form titanium silicide ($TiSi_2$) on said source/drain contact areas thereby leaving unreacted titanium on the insulated surfaces of said substrate;
stripping said unreacted titanium from said substrate;
stripping said portions from said top of said gate electrodes thereby forming a recessed gate electrode;

depositing a blanket layer of cobalt (Co) over said stripped portion of said gate electrode thereby including the exposed portions of said spacers thereby further including the surface of said substrate adjacent to said gate electrode; annealing said cobalt to form $CoSi_2$ over said gate; and removing selectively said cobalt layer over said gate electrodes by wet etching while leaving the layer of formed $CoSi_2$ on said top surface of said gate electrode.

5. The method of claim 4 wherein said polysilicon layer has a thickness of between 1500 and 3000 Angstrom.

6. The method of claim 4 wherein said titanium layer has a thickness of between 150 and 450 Angstrom.

7. The method of claim 4 wherein said portions over the top of said gate electrodes contain TiN and is between 500 and 1500 Angstrom thick.

8. The method of claim 4 wherein said conformal dielectric layer contains one of the elements from the group silicon nitride or silicon oxide or CVD oxide formed from a TEOS source thereby forming said spacers.

9. The method of claim 4 wherein said cobalt layer has a thickness of between 100 and 300 Angstrom.

10. The method of claim 4 wherein said annealing said titanium to form titanium silicide ($TiSi_2$) is a rapid thermal annealing in a temperature range of between 600 and 700 degrees C. for a time of between 20 and 40 seconds and then rapid thermal annealing in a temperature of between about 800 and 900 degrees C. for a time between 20 and 40 seconds.

11. The method of claim 4 wherein said annealing said deposited layer of cobalt thereby creating $CoSi_2$ over said gate is annealing at a temperature between about 500 and 850 degrees C.

12. The method of claim 4 with the additional step of forming a gate oxide on said device areas by thermal oxidation said gate oxide to be patterned to create openings above said source and drain regions said step of forming a gate oxide to be performed prior to said depositing a polysilicon layer on said substrate.

13. A method for forming a transistor comprising the steps of:

providing a semiconductor substrate;

forming shallow trench isolation (STI) regions within said substrate said STI's bordering on and delineating said transistor;

forming a gate electrode overlying said substrate and within the area delineated by said STI's said gate electrode having a lower layer containing polysilicon and an upper layer containing a dielectric material that functions as a masking layer;

forming sidewall spacers that are laterally adjacent to said gate electrodes;

forming source and drain regions within said substrate and adjacent to said gate electrode;

depositing a layer of titanium over said electrode thereby including said gate spacers and the area adjacent to said gate electrode including said STI's;

annealing said deposited layer of titanium with said substrate over the source and drain regions thereby forming thin layers of $TiSi_2$ over these regions;

removing selectively said unreacted titanium thereby also removing said upper layer of said gate electrode;

depositing a blanket layer of cobalt over said the exposed poly surface of said gate electrode including said gate spacers and the areas adjacent to said electrode further including said STI areas;

annealing said cobalt thereby forming a reactive layer of $CoSi_2$ on the surface of the poly layer of said gate electrode; and selectively removing unreacted cobalt thereby exposing said $TiSi_2$ layers over said source and drain regions thereby further exposing the layer of $CoSi_2$ on the top surface of said gate electrode.

14. The method of claim 13 wherein said forming a gate electrode comprises:

depositing a polysilicon layer on said substrate;

depositing a layer of titanium nitride on said polysilicon layer; and patterning said titanium nitride layer and said polysilicon layer by photoresist masking and anisotropic etching thereby forming said gate electrode whereby said gate electrode contains an upper layer of titanium nitride and a lower layer of polysilicon.

15. The method of claim 13 whereby said annealing to form thin layers of titanium silicide ($TiSi_2$) over the source/drain regions is a rapid thermal annealing in a temperature range of between 600 and 700 degrees C. for a time of between 20 and 40 seconds and then rapid thermal annealing in a temperature of between about 800 and 900 degrees C. for a time between 20 and 40 seconds.

16. The method of claim 13 wherein said annealing said deposited layer of cobalt thereby creating $CoSi_2$ over said gate is annealing at a temperature between about 500 and 850 degrees C.

17. The method of claim 13 wherein said removing selectively said unreacted titanium is:

removing said titanium from the surface of said substrate;

removing said titanium from said gate spacers; and removing said upper layer of said gate electrode thereby exposing the top surface of the polysilicon of said gate electrode thereby further exposing the top areas of said gate spacers.

18. The method of claim 13 wherein said polysilicon layer has a thickness of between 1500 and 3000 Angstrom.

19. The method of claim 13 wherein said titanium layer has a thickness of between 150 and 450 Angstrom.

20. The method of claim 13 wherein said upper layer of said gate electrodes contain TiN and is between 500 and 1500 Angstrom thick.

21. The method of claim 13 wherein said sidewall spacers contain one of the elements from the group silicon nitride or silicon oxide or CVD oxide formed from a TEOS source thereby forming said spacers.

22. The method of claim 13 wherein said cobalt layer has a thickness of between 100 and 300 Angstrom.

23. The method of claim 13 wherein said annealing said substrate to form titanium silicide ($TiSi_2$) is a rapid thermal annealing in a temperature range of between 600 and 700 degrees C. for a time of between 20 and 40 seconds and then rapid thermal annealing in a temperature of between about 800 and 900 degrees C. for a Lime between 20 and 40 seconds.

24. The method of claim 13 with the additional step of forming a gate oxide on said device areas by thermal oxidation said gate oxide to be patterned to create openings above said source and drain regions said step of forming a gate oxide to be performed prior to said depositing a polysilicon layer on said substrate.

* * * * *